(12) United States Patent
Waltener et al.

(10) Patent No.: US 9,571,085 B2
(45) Date of Patent: Feb. 14, 2017

(54) HIGH VOLTAGE DRIVER

(71) Applicant: Commissariat à l'énergie atomique et aux énergies alternatives, Paris (FR)

(72) Inventors: Guillaume Waltener, Grenoble (FR); Jose Luis Gonzalez Jimenez, Voreppe (FR)

(73) Assignee: Commissariat a l'energie atomique et aux energies alternatives (FR)

( * ) Notice: Subject to any disclaimer, the term of this patent is extended or adjusted under 35 U.S.C. 154(b) by 69 days.

(21) Appl. No.: 14/724,741

(22) Filed: May 28, 2015

(65) Prior Publication Data

US 2016/0006425 A1    Jan. 7, 2016

(30) Foreign Application Priority Data

Jul. 4, 2014   (FR) ...................................... 14 56429

(51) Int. Cl.
*H03K 17/00* (2006.01)
*H03K 17/08* (2006.01)
*H03K 5/1252* (2006.01)
*H03K 19/0175* (2006.01)
*G02F 1/01* (2006.01)
*H03K 3/012* (2006.01)

(52) U.S. Cl.
CPC ............ *H03K 17/08* (2013.01); *G02F 1/011* (2013.01); *G02F 1/0121* (2013.01); *H03K 3/012* (2013.01); *H03K 5/1252* (2013.01); *H03K 19/017509* (2013.01)

(58) Field of Classification Search
CPC ....................................................... H03K 17/08
See application file for complete search history.

(56) References Cited

U.S. PATENT DOCUMENTS 6,211,706 B1 *   4/2001   Choi ................... H03K 17/063
                                                                327/108
9,013,212 B2 *   4/2015   Kumar ................. G11C 7/1057
                                                                327/108

FOREIGN PATENT DOCUMENTS

EP      0542480 A2   5/1993
WO      8504537 A1   10/1985

OTHER PUBLICATIONS

"French Search Report," issued in counterpart French Application No. FR14/56429, Jan. 30, 2015, Publisher: inpi, Published in: FR.
(Continued)

*Primary Examiner* — Hai L Nguyen
(74) *Attorney, Agent, or Firm* — Kaplan Breyer Schwarz & Ottesen, LLP

(57) ABSTRACT

The invention concerns a high voltage driver comprising: first and second cascoded transistors (102, 104) adapted to generate an output signal ($V_{OUT}$) based on a first voltage signal ($V_{SL}$) having a first voltage range and on a second voltage signal ($V_{SH}$) having a voltage range shifted with respect to the first voltage range, the output signal having a second voltage range greater than the first voltage range; and a pulse generator (128) comprising a passive high-pass filter adapted to generate voltage pulses based on at least one of the first and second voltage signals and to provide the voltage pulses to a control node of at least one of the first and second transistors.

12 Claims, 2 Drawing Sheets

(56) References Cited

OTHER PUBLICATIONS

Palermo, et al., "High-Speed Transmitters in 90nm CMOS for High-Density Optical Interconnects", , Publisher: Computer Systems Library, Stanford University, Published in: US Sep. /2006.
Arithmos, Inc., Jul. 27, 1995, Publisher: PCT, Published in: WO.

* cited by examiner

HIGH VOLTAGE DRIVER

The present patent application claims the priority benefit of French patent application FR14/56429, filed Jul. 4, 2014, the contents of which are incorporated herein by reference in its entirety to the maximum extent allowable by law.

FIELD

The present disclosure relates to the field of high voltage drivers and methods of generating high voltage signals.

BACKGROUND

In certain applications it may be necessary to generate a voltage signal having a voltage range greater than the safe operating voltage of the transistor technology being used. For example, in CMOS 65 nm technology, the voltage applied across the terminals of the transistors should generally not exceed 1.2 V, whereas it may be desired to generate a voltage signal having a greater voltage range.

A solution that has been proposed is to use a technique of cascoding transistors. However, while such a technique works well while the input voltage is static, transitions of the input voltage between low and high levels can cause spikes in the voltage across either or both of the cascoded transistors that correspond to an overvoltage, in other words a voltage exceeding the safe voltage limit of the transistor technology. While this may not result in an immediate failure of the transistors, over time there will a degradation in their performance, leading to a reduced life span.

There is thus a need in the art for a high voltage driver that prevents or at least partially reduces overvoltages, and that has a low surface area and/or relatively low power consumption.

SUMMARY

It is an aim of embodiments of the present disclosure to at least partially address one or more needs in the prior art.

According to one aspect, there is provided a high voltage driver comprising: first and second cascoded transistors coupled in series; a low voltage path transmitting a first voltage signal in a first voltage range, the low voltage path comprising a first buffer or inverter having an output coupled to a first main current node of the first transistor; a high voltage path transmitting second voltage signal in a voltage range shifted with respect to the first voltage range, the high voltage path comprising a second buffer or inverter having an output coupled to a first main current node of the second transistor; an output node coupled to second main current nodes of the first and second transistors and providing an output signal based on the first and second voltage signals, the output signal having a second voltage range greater than the first voltage range; and a pulse generator coupled to a control node of at least one of the first and second transistors, the pulse generator comprising a passive high-pass filter and being adapted to generate, based on one or more input signals comprising at least one of the first and second voltage signals, at least one filtered voltage signal having a DC level at an intermediate voltage in the second voltage range and having voltage pulses in response to rising or falling edges of the one or more input signals. The intermediate voltage is for example at the mid-point of the second voltage range plus or minus 5 percent.

According to one embodiment, the pulse generator is adapted to generate the DC level when the voltage level of the one or more input signals is stable.

According to one embodiment, the passive high-pass filter is adapted to generate the voltage pulses based only on said first voltage signal and to provide the voltage pulses to the control nodes of both of the first and second transistors.

According to one embodiment, the high voltage driver further comprises: an input node adapted to receive an input signal, the input node being coupled to the low voltage path; and a level shifter coupling the input node to the high voltage path, the level shifter being adapted to shift the voltage range of the input signal to generate the second voltage signal.

According to one embodiment, the low voltage path, the high voltage path and the level shifter are adapted to delay the input signal such that the first and second voltage signals applied to the first main current nodes of the first and second transistors are synchronized in time.

According to one embodiment, the low voltage path comprises: a third buffer or inverter having an output coupled to the pulse generator; and at least one further buffer or inverter coupled between the output of the third buffer or inverter and an input of the first buffer or inverter.

According to one embodiment, the first transistor is an n-channel MOS transistor, the second transistor is a p-channel MOS transistor, and the passive high-pass filter is adapted to: generate pulses that are positive with respect to the intermediate voltage level in response to rising edges of the one or more input signals; and generate pulses that are negative with respect to the intermediate voltage level in response to falling edges of the one or more input signals.

According to one embodiment, the pulse generator comprises: a first output coupled to the control node of the first transistor, the pulse generator being adapted to generate at the first output a first filtered voltage signal having the DC level at the intermediate voltage and the positive voltage pulses; and a second output coupled to the control node of the second transistor, the pulse generator being adapted to generate at the second output a second filtered voltage signal having the DC level at the intermediate voltage and the negative voltage pulses.

According to one embodiment, the passive high-pass filter is an RC filter comprising: a first capacitor coupled between an input of the pulse generator and the control node of the first transistor; and a first resistor coupled between the control node of the first transistor and the intermediate voltage level.

According to one embodiment, the passive high-pass filter further comprises: a second capacitor coupled between the input of the pulse generator and the control node of the second transistor; and a second resistor coupled between the control node of the second transistor and the intermediate voltage level.

According to a further aspect, there is provided a photonic modulator comprising the above high voltage driver.

According to a further aspect, there is provided a method of generating a high voltage signal comprising: generating, based on a first voltage signal having a first voltage range and a second voltage signal having a voltage range shifted with respect to the first voltage range, an output signal by first and second cascoded transistors coupled in series, wherein the first voltage signal is transmitted by a low voltage path comprising a first buffer or inverter having an output coupled to a first main current node of the first transistor, the second voltage signal is transmitted by a high voltage path comprising a second buffer or inverter having an output coupled to a first main current node of the second transistor, and the output signal has a second voltage range greater than the first voltage range; and generating, by a pulse generator comprising a passive high-pass filter and coupled to a control node of at least one of the first and second transistors, based on one or more input signals comprising at least one of the first and second voltage signals, at least one filtered voltage signal having a DC level at an intermediate voltage in the second voltage range and having voltage pulses in response to rising or falling edges of the one or more input signals.

According to a further aspect, there is provided a high voltage driver comprising: first and second cascoded transistors adapted to generate an output signal based on a first voltage signal having a first voltage range and on a second voltage signal having a voltage range shifted with respect to the first voltage range, the output signal having a second voltage range greater than the first voltage range; and a pulse generator comprising a passive high-pass filter adapted to generate voltage pulses based on at least one of the first and second voltage signals and to provide the voltage pulses to a control node of at least one of the first and second transistors.

According to a further aspect, there is provided a method of generating a high voltage signal comprising: generating an output voltage by first and second cascoded transistors based on a first voltage signal having a first voltage range and on a second voltage signal having a voltage range shifted with respect to the first voltage range, the output signal having a second voltage range greater than the first voltage range; generating, by a passive high-pass filter of a pulse generator, voltage pulses based on at least one of the first and second voltage signals; and providing the voltage pulses to a control node of at least one of the first and second transistors.

BRIEF DESCRIPTION OF THE DRAWINGS

The foregoing and other features and advantages will become apparent from the following detailed description of embodiments, given by way of illustration and not limitation with reference to the accompanying drawings, in which.

DETAILED DESCRIPTION

Figure 1:
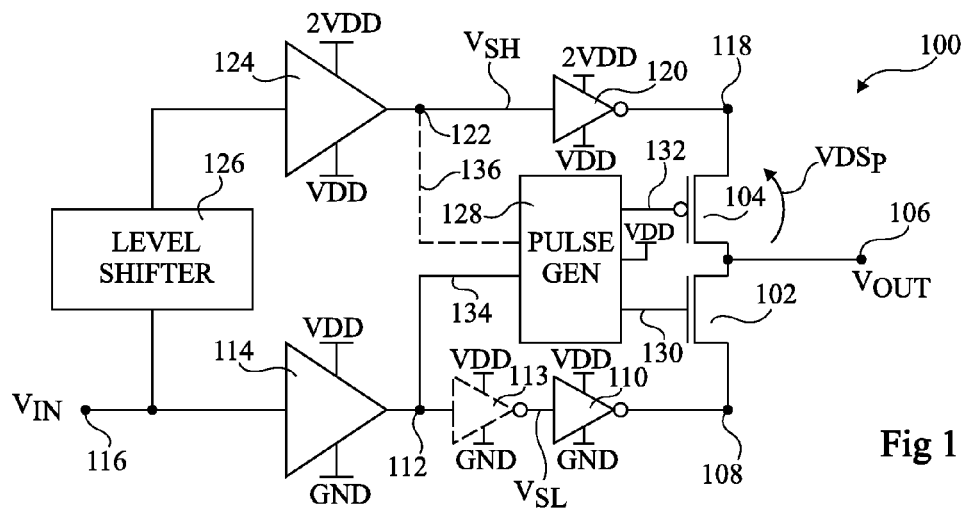
FIG. 1 schematically illustrates a high voltage driver according to example embodiment of the present disclosure.

FIG. 1 illustrates a high voltage driver 100 according to example embodiment. Such a driver is for example used to drive a device (not illustrated in FIG. 1) that is to be driven by a high voltage, in other words a voltage higher than the normal voltage limit of the relevant transistor technology. For example, in the case of 65 nm CMOS technology, the normal voltage limit is generally at around 1.2 V.

Furthermore, in some embodiments described in greater detail below, the high voltage driver is adapted to operate at relatively high frequencies, for example at frequencies of between 5 and 10 GHz. For example, the high voltage driver is used to drive a photonic device, or as a voltage converter for input/output data signals of an integrated circuit.

The driver 100 comprises a pair of cascoded transistors 102, 104, coupled in series via their main current nodes. Transistor 102 is for example an n-channel MOS transistor, and transistor 104 is for example a p-channel MOS transistor. The drains of transistors 102, 104 are coupled to an output node 106 of the driver, and provide the output signal $V_{OUT}$.

The source of transistor 102 is coupled to a node 108 of a low-voltage path. The signal transmitted along the low-voltage path is for example in the range 0 to VDD, where VDD is a supply voltage of for example between 1 and 2 V, and in one example at substantially 1.2 V. The term "substantially" is used herein to designate a tolerance of plus or minus 5 percent.

The low-voltage path comprises an inverter 110 having its output coupled to the node 108 and its input coupled to a node 112, in some embodiments via one or more further inverters 113, for receiving a voltage signal $V_{SL}$ provided by a buffer 114. The input of the buffer 114 is coupled to an input node 116 of the driver, which receives an input voltage signal $V_{IN}$. The buffer 114 for example comprises a plurality of inverters of different sizes coupled in series, the smallest being coupled to the input node 116, and the inverters getting progressively larger towards the output of the buffer 114.

The source of transistor 104 is coupled to node 118 of a high-voltage path. The signal transmitted along the high-voltage path is level-shifted with respect to the low-voltage path, and is for example in the range VDD to 2VDD. In one example, the voltage range of the high-voltage path is substantially 1.2 to 2.4 V.

The high-voltage path comprises an inverter 120 having its input coupled to a node 122 receiving a voltage signal $V_{SH}$ provided by a buffer 124. The input of buffer 124 is coupled to the output of a level shifter 126. The buffer 124 for example comprises a plurality of inverters of different sizes coupled in series, the smallest being coupled to the output of the level shifter 126, and the inverters getting progressively larger towards the output of the buffer 124. The level shifter 126 is in turn coupled to the input node 116, and shifts the voltage range of the input signal $V_{IN}$ to the voltage range of the high-voltage path. For example, the level shifter 126 shifts the input signal $V_{IN}$ by substantially the level of the supply voltage VDD.

The control nodes of transistors 102, 104 are driven by a pulse generator 128. For example, the gate of transistor 102 is coupled to an output line 130 of the pulse generator 128, and the gate of transistor 104 is coupled to an output line 132 of the pulse generator 128. In alternative embodiments, the gates of the transistors 102, 104 could be driven by the same output line of the pulse generator 128.

The pulse generator 128 for example comprises a passive high-pass filter, in other words a high-pass filter based only on passive components, such as resistors, capacitors and/or inductors. For example, the pulse generator 128 comprises an RC or LC filter. The pulse generator 128 for example has an input line 134 coupled to the node 112, and as represented by a dashed line 136, it may also have a further input line coupled to the node 122. The pulse generator 128 is for example further coupled to the supply voltage VDD, and generates a voltage signal generally at VDD, but with positive voltage pulses on rising edges of the voltage signal $V_{SL}$ and/or $V_{SH}$, and negative pulses of falling edges of the voltage signal $V_{SL}$ and/or $V_{SH}$.

Operation of the circuit of FIG. 1 will now be described in more detail with reference to FIG. 2.

Figure 2:
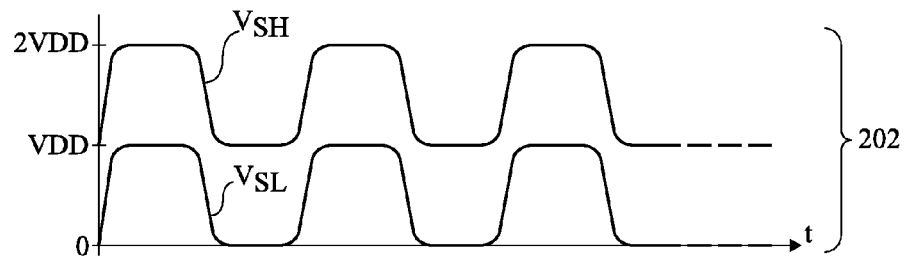
FIG. 2 is a timing diagram illustrating signals in the circuit of FIG. 1 according to example embodiment.
Figure 2:
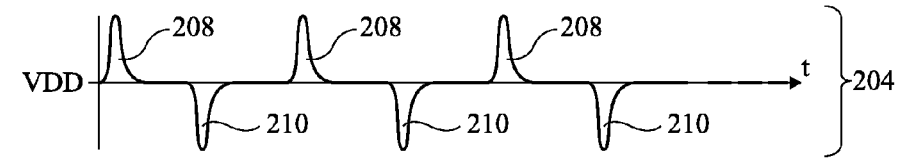
Figure 2:
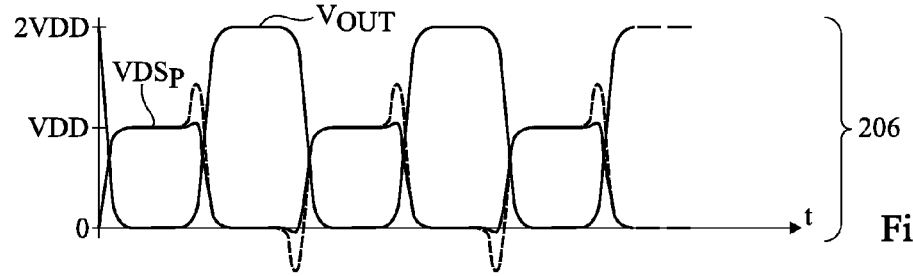

FIG. 2 shows timing diagrams 202, 204 and 206.

The timing diagram 202 illustrates an example of the voltage signals $V_{SL}$ and $V_{SH}$, in the case that the voltage signals are substantially square waves, and the low-voltage path has the voltage range 0 to VDD, and the high-voltage path has the voltage range VDD to 2VDD. As illustrated, the signals $V_{SL}$ and $V_{SH}$ are for example synchronized in time with each other.

The timing diagram 204 illustrates an example of the corresponding pulse signal generated by the pulse generator 128 on line 130 and/or 132 based on the signal $V_{SL}$ and/or $V_{SH}$. This signal for example has a DC level of VDD or of any voltage allowing the transistor to be switched without damaging it. The pulse signal also comprises high pulses 208 occurring at rising edges of the signals $V_{SL}$, $V_{SH}$, and low pulses 210 occurring at falling edges of the signals $V_{SL}$, $V_{SH}$. Each pulse for example has a magnitude of between 0.1 and 1 V, and a duration of between one tenth and a half of the bit period.

A timing diagram 206 illustrates an example of the corresponding output signal $V_{OUT}$, which transitions, on rising edges of the signals $V_{SL}$ and $V_{SH}$, from a high level at or close to 2VDD to a low level at or close to 0 V, and on falling edges of the signals $V_{SL}$ and $V_{SH}$, from a low level at or close to 0 V to a high level at or close to 2VDD.

The timing diagram 206 also illustrates the source drain voltage $VDS_P$ illustrated in FIG. 1 of the PMOS transistor 104, which is generally in the range 0 V to VDD. However, dashed portions in FIG. 2 represent positive and negative voltage spikes that could occur at each rising or falling edge of the signals $V_{SL}$ and $V_{SH}$ if the pulse generator 128 were not present. Indeed, the positive peaks result from a delay in bringing the voltage at the output node 106 to the high level of 2VDD, after the node 118 has already reached the level 2VDD, and the negative peaks result from a delay in bringing the voltage at the output node 106 to the low level of 0 V, after the node 118 has already been reduced to VDD.

By applying negative pulses to the control node of transistor 104 at the falling edges of the signals $V_{SL}$ and $V_{SH}$, the conduction of transistor 104 can be increased, thereby causing the voltage at the output node 106 to be increased more quickly. The positive voltage spikes in the voltage $VDS_P$ are thus substantially or entirely removed.

By applying positive pulses to the control node of the transistor 102 at the rising edges of the signals $V_{SL}$ and $V_{SH}$, the conduction of transistor 102 can be increased, thereby causing the voltage at the output node to be decreased more quickly. The negative voltage spikes in the voltage $VDS_P$ are thus substantially or entirely removed.

In some embodiments, only the negative pulses 210 could be generated by the pulse generator 128 and applied to the control node of the transistor 104.

Figure 3A:
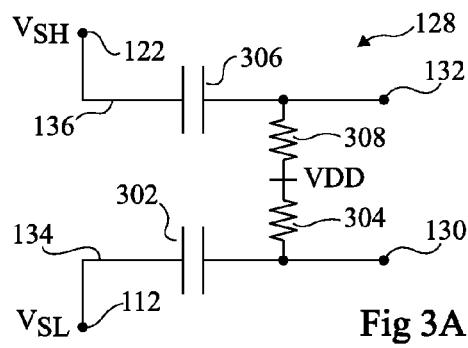
FIG. 3A schematically illustrates a pulse generator of FIG. 1 in more detail according to example embodiment.

FIG. 3A schematically illustrates the pulse generator 128 in more detail according to example embodiment in which it is implemented by an RC filter. The pulse generator 128 for example comprises a capacitor 302 coupled between the input line 134 and the output line 130, and a resistor 304 coupled between the output line 130 and the supply voltage VDD. The pulse generator 128 also for example comprises a further capacitor 306 coupled between the input line 136 and the output line 132, and a further resistor 308 coupled between the output line 132 and the supply voltage VDD.

While the resistors 304, 308 are coupled to the supply voltage VDD, in alternative embodiments they could be coupled to an alternative intermediate voltage in the voltage range of the output voltage $V_{OUT}$.

The capacitors 302 and 306 each for example have capacitances in the range of 10 to 100 fF, and the resistors each for example have resistances in the range 500 to 2 k ohms.

Figure 3B:
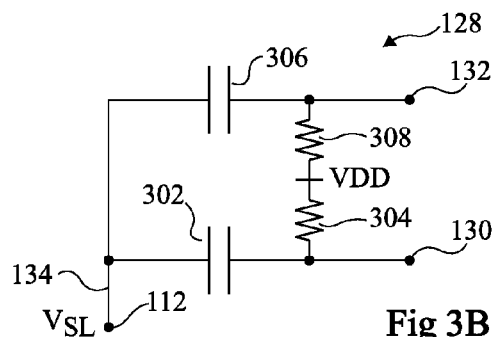
FIG. 3B schematically illustrates the pulse generator of FIG. 1 in more detail according to a further example embodiment.

FIG. 3B schematically illustrates the pulse generator 128 according to another example embodiment similar to that of FIG. 3A, and like features are labelled with like reference numerals and will not be described again in detail. However, in the circuit of FIG. 3B, there is no input line 136, and instead the capacitor 306 is coupled between the input line 134 and the output line 132.

In an alternative embodiment of FIG. 3B, the capacitor 306 and resistor 308 could be omitted, and both of the transistors could be coupled to the same output line 130 of the pulse generator 128. An advantage of using a separate filter for each branch is that the capacitance of each capacitor can be chosen to be adapted to the respective transistor 102, 104.

Figure 4:
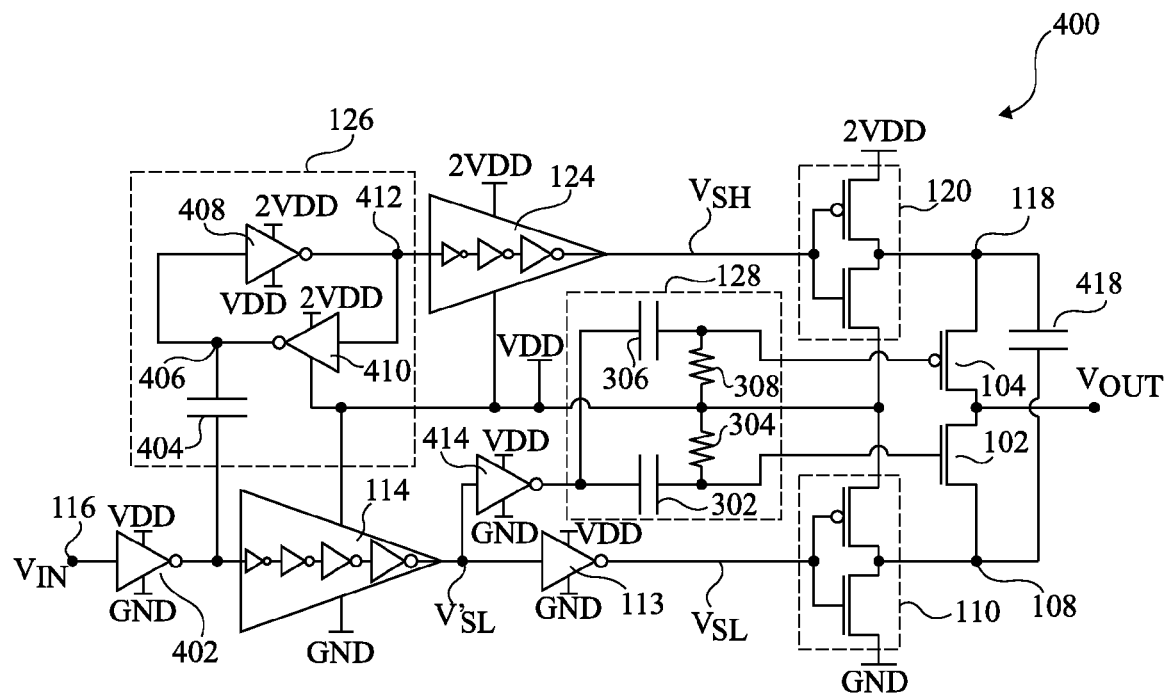
FIG. 4 schematically illustrates a high voltage driver according to a further example embodiment of the present disclosure.

FIG. 4 schematically illustrates a high voltage driver 400 according to an alternative example embodiment. The driver 400 is very similar of the driver 100 of FIG. 1, and like features have been labelled with like reference numerals and will not be described again in detail.

In the example of FIG. 4, an inverter 402 is positioned between the input node 116 and the input of the buffer 114. The level shifter 126 is coupled to the output of the inverter 402.

An example of the circuit implementing the level shifter 126 is shown in FIG. 4, and comprises a capacitor 404 coupled between the output of inverter 402 and a node 406. A pair of inverters 408, 410 are cross-coupled between the node 406 and an output node 412 of the level shifter. The supply voltages of the inverters 408 and 410 are for example VDD and 2VDD, such that the capacitor 404 and inverters 408, 410 together positively shift the DC level of the input signal by the level of VDD.

In the example of FIG. 4, the pulse generator 128 is implemented by the circuit of FIG. 3B, receiving only the signal $V_{SL}$' from an output of the buffer 114. The signal $V_{SL}$' is for example supplied to the input of the pulse generator 128 via a further inverter 414.

The inverters 110 and 120 are also illustrated in more detail in FIG. 4, and each for example comprises a PMOS and NNOS transistor coupled in series between the respective supply voltages.

The time delay introduced by the inverters 113 and 110 is for example chosen to be substantially equal to the time delay introduced by the inverter 414 and the pulse generator 128. Furthermore, the time delay introduced by the buffer 114 and the inverters 113 and 110 is for example chosen to be substantially equal to the time delay introduced by the level shifter 126, the buffer 124 and the inverter 120.

FIG. 4 also illustrates a capacitor 418, which is for example coupled between the source nodes 108 and 118 of the transistors 102, 104 to smooth the voltage applied across these transistors.

Figure 5:
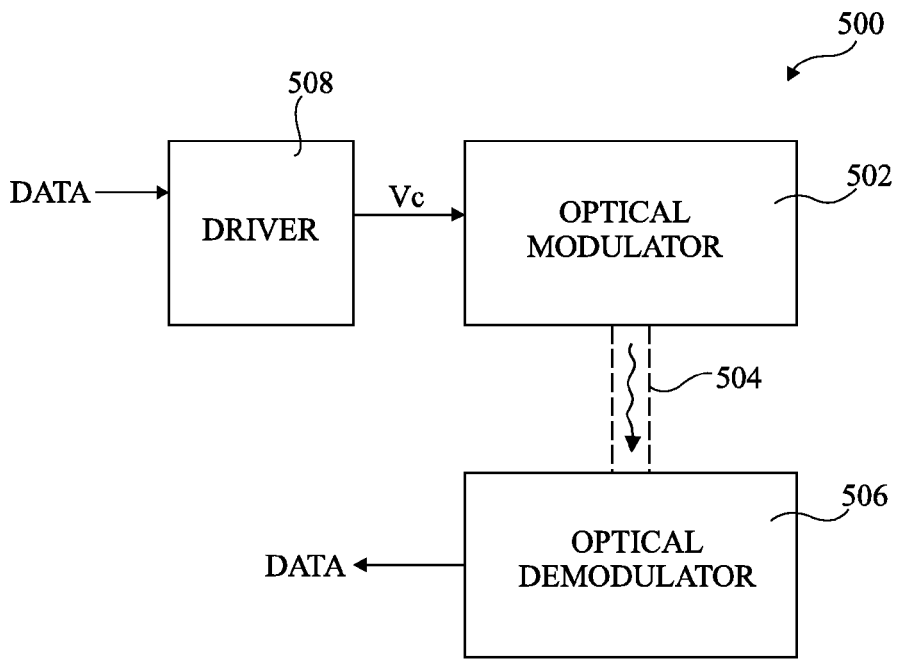
FIG. 5 schematically illustrates an optical transmission system comprising a high voltage driver according to example embodiment of the present disclosure.

FIG. 5 schematically illustrates an optical transmission system according to example embodiment. The system 500 is for example integrated on-chip, and comprises an optical modulator (OPTICAL MODULATOR) 502 that transmits an optical signal via a waveguide 504 to an optical demodulator (OPTICAL DEMODULATOR) 506. The optical modulator 502 for example comprises a ring modulator (not illustrated in FIG. 5) having an oscillation frequency variable by the level of a voltage signal $V_C$ that is applied to it. The voltage signal $V_C$ for example has a voltage range of at least 2 V, and for example of 2.2 V or more. The optical modulator 502 receives voltage signal $V_C$ via a photonic modulator driver (DRIVER) 508, which for example comprises the circuit of FIG. 1 or 4, and generates the voltage $V_C$ based on an input signal DATA. The data signal DATA for example has a bit rate of between 10 and 20 Gb/s.

An advantage of the embodiments described herein is that, by providing a pulse generator formed of a passive high-pass filter, an overvoltage across the transistors of a high voltage driver can be reduced or entirely avoided without greatly increasing the surface area or power consumption of the circuit.

Having thus described at least one illustrative embodiment, various alterations, modifications and improvements will readily occur to those skilled in the art.

For example, while driver circuits have been described comprises a high and a low voltage path, it will be apparent to those skilled in the art that in alternative embodiments one or more additional paths could be added in order to generate even higher output voltage levels.

Furthermore, while the voltage range in each of the low and high voltage paths in the described embodiments is equal to the supply voltage VDD, in alternative embodiments, other voltage ranges would be possible. Furthermore, it will also be apparent to those skilled in the art that the supply voltage VDD in the various embodiments could be at any level, for example between 1 and 2 V, and rather than being at 0 V, the ground voltage could be a supply voltage at a different voltage level, such as a negative level.

Furthermore, while transistors based on MOS technology are described throughout, in alternative embodiments other transistor technologies could be used, such as bipolar technology.

Furthermore, it will be apparent to those skilled in the art that the various features described in relation to the various embodiments could be combined, in alternative embodiments, in any combination.

The invention claimed is:

1. A high voltage driver comprising:
   first and second cascoded transistors (102, 104) coupled in series;
   a low voltage path transmitting a first voltage signal ($V_{SL}$) in a first voltage range (GND to VDD), the low voltage path comprising a first buffer or inverter (110, 114) having an output coupled to a first main current node (108) of the first transistor (102);
   a high voltage path transmitting second voltage signal ($V_{SH}$) in a voltage range (VDD to 2VDD) shifted with respect to the first voltage range, the high voltage path comprising a second buffer or inverter (120, 124) having an output coupled to a first main current node (118) of the second transistor (104);
   an output node (106) coupled to second main current nodes of the first and second transistors and providing an output signal ($V_{OUT}$) based on the first and second voltage signals (VSL, VSH), the output signal ($V_{OUT}$) having a second voltage range (GND to 2VDD) greater than the first voltage range; and
   a pulse generator (128) coupled to a control node of at least one of the first and second transistors (102, 104), the pulse generator (128) comprising a passive high-pass filter and being adapted to generate, based on one or more input signals comprising at least one of the first and second voltage signals, at least one filtered voltage signal having a DC level at an intermediate voltage in the second voltage range and having voltage pulses in response to rising or falling edges of the one or more input signals.

2. The high voltage driver of claim 1, wherein the pulse generator (128) is adapted to generate the DC level when the voltage level of the one or more input signals is stable.

3. The high voltage driver of claim 1, wherein the passive high-pass filter is adapted to generate the voltage pulses based only on said first voltage signal ($V_{SL}$, $V_{SL}'$) and to provide the voltage pulses to the control nodes of both of the first and second transistors (102, 104).

4. The high voltage driver of claim 1, further comprising:
   an input node (116) adapted to receive an input signal ($V_{IN}$), the input node being coupled to the low voltage path; and
   a level shifter (126) coupling the input node (116) to the high voltage path, the level shifter (126) being adapted to shift the voltage range of the input signal to generate the second voltage signal ($V_{SH}$).

5. The high voltage driver of claim 4, wherein the low voltage path, the high voltage path and the level shifter (126) are adapted to delay the input signal ($V_{IN}$) such that the first and second voltage signals applied to the first main current nodes of the first and second transistors are synchronized in time.

6. The high voltage driver of claim 1, wherein the low voltage path comprises:
   a third buffer or inverter (114) having an output coupled to the pulse generator (128); and
   at least one further buffer or inverter (113) coupled between the output of the third buffer or inverter and an input of the first buffer or inverter (110).

7. The high voltage driver of claim 1, wherein the first transistor (102) is an n-channel MOS transistor, the second transistor (104) is a p-channel MOS transistor, and the passive high-pass filter is adapted to:
   generate pulses (208) that are positive with respect to the intermediate voltage level (VDD) in response to rising edges of the one or more input signals; and
   generate pulses (210) that are negative with respect to the intermediate voltage level (VDD) in response to falling edges of the one or more input signals.

8. The high voltage driver of claim 7, wherein the pulse generator (128) comprises:
   a first output (130) coupled to the control node of the first transistor (102), the pulse generator (128) being adapted to generate at the first output (130) a first filtered voltage signal having the DC level at the intermediate voltage and the positive voltage pulses (208); and
   a second output (132) coupled to the control node of the second transistor (104), the pulse generator (128) being adapted to generate at the second output (132) a second filtered voltage signal having the DC level at the intermediate voltage and the negative voltage pulses (210).

9. The high voltage driver of claim 1, wherein the passive high-pass filter is an RC filter comprising:
   a first capacitor (302) coupled between an input (134, 136) of the pulse generator (128) and the control node of the first transistor (102); and
   a first resistor (304) coupled between the control node of the first transistor (102) and the intermediate voltage level (VDD).

10. The high voltage driver of claim 9, wherein the passive high-pass filter further comprises:

a second capacitor (306) coupled between the input (134, 136) of the pulse generator (128) and the control node of the second transistor (104); and a second resistor (308) coupled between the control node of the second transistor (102) and the intermediate voltage level (VDD).

11. A photonic modulator comprising the high voltage driver of claim 1.

12. A method of generating a high voltage signal comprising:

generating, based on a first voltage signal ($V_{SL}$, $V_{SL}'$) having a first voltage range and a second voltage signal ($V_{SH}$, $V_{SH}'$) having a voltage range shifted with respect to the first voltage range, an output signal by first and second cascoded transistors (102, 104) coupled in series, wherein the first voltage signal ($V_{SL}$) is transmitted by a low voltage path comprising a first buffer or inverter (110, 114) having an output coupled to a first main current node (108) of the first transistor (102), the second voltage signal ($V_{SH}$) is transmitted by a high voltage path comprising a second buffer or inverter (120, 124) having an output coupled to a first main current node (118) of the second transistor (104), and the output signal has a second voltage range greater than the first voltage range; and generating, by a pulse generator (128) comprising a passive high-pass filter and coupled to a control node of at least one of the first and second transistors (102, 104), based on one or more input signals comprising at least one of the first and second voltage signals, at least one filtered voltage signal having a DC level at an intermediate voltage (VDD) in the second voltage range and having voltage pulses in response to rising or falling edges of the one or more input signals.

\* \* \* \* \*